United States Patent [19]

Koyama

[11] Patent Number: 4,860,065
[45] Date of Patent: Aug. 22, 1989

[54] SEMICONDUCTOR INTEGRATED CIRCUIT DEVICE

[75] Inventor: Tsunehiro Koyama, Hyogo, Japan

[73] Assignee: Mitsubishi Denki Kabushiki Kaisha, Tokyo, Japan

[21] Appl. No.: 937,119

[22] Filed: Dec. 2, 1986

[30] Foreign Application Priority Data

Dec. 2, 1985 [JP] Japan ................................ 60-271062

[51] Int. Cl.$^4$ .......................................... H01L 27/04
[52] U.S. Cl. ...................................... 357/15; 307/456; 307/458; 307/317.2; 357/44; 357/45
[58] Field of Search .................... 307/456, 458, 317 A; 357/15, 45, 50, 68, 44

[56] References Cited

U.S. PATENT DOCUMENTS

| | | | |
|---|---|---|---|
| 4,380,708 | 4/1983 | Hart ................................ | 357/59 A |
| 4,538,244 | 8/1985 | Sugo et al. .......................... | 357/15 |
| 4,584,594 | 4/1986 | Vora et al. ........................... | 357/15 |
| 4,613,887 | 9/1986 | Fukuda et al. ....................... | 357/15 |
| 4,628,339 | 12/1986 | Vora et al. ........................... | 357/15 |
| 4,730,126 | 3/1988 | Chen ................................... | 307/456 |

OTHER PUBLICATIONS

"Devices and Circuits for Bipolar. (V)LSI", Jan Lohstroh, Proceedings of the IEEE, vol. 69, No. 7, Jul. 1981, pp. 812–824.
"Oxide Isolation Builds a Better Schottky TTL", B. Bechdolt, D. Ferris, P. Griffith, Electronics, Mar. 1, 1979, pp. 111–116.
"ISL, A Fast and Dense Low-Power Logic, Made in a Standard Schottky Process", Jan Lohstroh, IEEE Journal of Solid-State Circuits, vol. SC-14, No. 3, Jun. 1979.
"Advanced Schottky Family"; ALS and AS Applications, Application Report published by Texas Instruments, p. 6.

Primary Examiner—William L. Sikes
Attorney, Agent, or Firm—Lowe, Price, LeBlanc, Becker & Shur

[57] ABSTRACT

According to the present invention, an IC device includes an input PNP transistor, a first NPN transistor, a second NPN transistor and an SBD; and the device is characterized in that an isolation layer (16) is provided between the input PNP transistor (1) and the SBD (7); and in that the lead wires by which the emitter of the first NPN transistor (11) and the base of the second NPN transistor (9) are connected to the anode of the SBD (7) are shorter than the lead wire between the base of the input PNP transistor (1) and the cathode of the SBD (7).

1 Claim, 3 Drawing Sheets

SEMICONDUCTOR INTEGRATED CIRCUIT DEVICE

BACKGROUND OF THE INVENTION

1. Field of the Invention

This invention relates to a semiconductor IC device and more particularly to an improvement in which transmission delay time due to a parasitic capacitance is minimized in a TTL-IC device.

2. Description of the Prior Art

FIG. 1 is a diagram of an inverter circuit, such as shown in "Advanced Schottky Family" with a subtitle "ALS and AS Applications" of Application Report published in 1984 by Texas Instruments. FIGS. 2A and 2B respectively show a plan view and a corresponding sectional view in the vicinity of an input transistor in such an inverter, which is adopted in M74ALS1034P (Lot No. 5270P1) of Mitsubishi.

Referring to these FIGS. 1, 2A and 2B in which the same reference characters are used for corresponding portions, an input PNP transistor 1 is formed in an element region 8 of an N type isolated by an isolation layer 16 on a semiconductor substrate 15 of a P type. With this PNP transistor 1, a base region 1a in an N epitaxial layer 20 is connected through an N buried layer 14 and an N+ diffused layer 13 to an input terminal 3 by a metal lead 2; a collector region 1b is connected to a grounding terminal 4 by a metal lead 17; and an emitter region 1c is connected through a resistor 5 to a power terminal 6 by a metal lead 18. A schottky barrier diode (SBD) 7 is also formed in the same element region 8. A cathode of this SBD 7 is connected by the metal lead 2 to the input terminal 3 through the base region 1a of the input PNP transistor 1, while an anode of the SBD 7 is connected by a metal lead 10 to an emitter of a first NPN transistor 11 and a base of a second NPN transistor 9. In FIG. 1, there are further provided a third NPN transistor 21 and a resistor 12, while the metal lead 10 causes a parasitic capacitance 19.

When a logic "L" of a low voltage is applied to the input terminal 3 in the above structured circuit, the PNP transistor 1 is turned on and causes a "L" current therethrough; as a result, each of the NPN transistors 11, 9, 21 is turned off. At this time, the SBD 7 is supplied with a forward voltage, and then electric charge accumulated in the base region of the second NPN transistor 9 and the parasitic capacitance 19 is discharged. This makes it easy to turn off the second NPN transistor 9.

On the other hand, when a logic "H" of a high voltage is applied to the input terminal 3, the PNP transistor 1 is turned off. Accordingly, the NPN transistors 11, 9, and 21 are turned on in order. At this time, it is necessary to charge the parasitic capacitance 19 up to $2V_{BE}$ ($V_{BE}$: base-emitter voltage) so that the second NPN transistor may be turned on.

It will be understood from the following equation that time T necessary for charging up the parasitic capacitance 19 depends directly on total area S of the metal lead 10.

$$T = \frac{C_o S (2V_{BE} - V_{IL} - V_F)}{I}$$

$C_o$: capacity per unit area of the metal lead 10,
$I$: emitter current of the first NPN transistor 11,
$V_{IL}$: input "L" voltage,
$V_F$: forward voltage of the SBD 7

When the first and second NPN transistor 11, 9 are formed far away from the input PNP transistor 1 for a certain reason, the metal lead 10 becomes long because the SBD 7 and the input PNP transistor 1 in the above conventional IC device are always formed in the same element region 8. This results in increase of total area S of the metal lead 10. Therefore, when the input signal changes from "L" to "H", longer time is required for charging up the parasitic capacitance 19. This means increase of the transmission delay time.

SUMMARY OF THE INVENTION

In view of the above described problem in the prior art, it is a major object of this invention to provide a TTL-IC device in which transmission delay time is reduced by minimizing the parasitic capacitance.

According to the present invention, an IC device formed on a P type semiconductor substrate includes an input PNP transistor having an emitter and a base; a first NPN transistor having an emitter and a base, the base of the first NPN transistor being connected to the emitter of the input PNP transistor by a lead wire; an SBD having an anode and a cathode, the anode and cathode of the SBD being connected to the emitter of the first NPN transistor and the base of the input PNP transistor by lead wires respectively; and a second NPN transistor having a base, the base of the second NPN transistor also being connected to the anode of the SBD by a lead wire: and the device is characterized in that an isolation layer is provided between the input PNP transistor and the SBD; and in that the lead wires by which the emitter of the first NPN transistor and the base of the second NPN transistor are connected to the anode of the SBD are shorter than the lead wire between the base of the input PNP transistor and the cathode of the SBD.

Namely, since the SBD is formed separately away from the input PNP transistor and near to the first and second NPN transistors, total area of the lead wires by which the first and second NPN transistors are connected to the SBD can be minimized. As a result, time required for charging up the parasitic capacitance due to the lead wires is reduced, and thus the transmission delay time is effectively minimized. This merit is prominent particularly in an input circuit of a NAND logic.

These objects and other objects, features, aspects and advantages of the present invention will become more apparent from the following detailed description of the present invention when taken in conjunction with the accompanying drawings.

BRIEF DESCRIPTION OF THE DRAWINGS

It is noted that the same reference characters are used in the figures for corresponding portions.

DESCRIPTION OF THE PREFERRED EMBODIMENTS

Figure 3A:
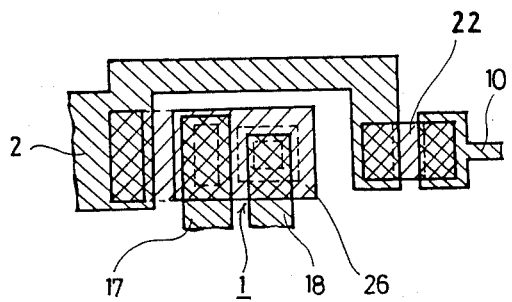
FIGS. 3A and 3B are a plan view and a corresponding sectional view respectively, in the vicinity of a input transistor in an inverter according to the present invention.
Figure 3B:
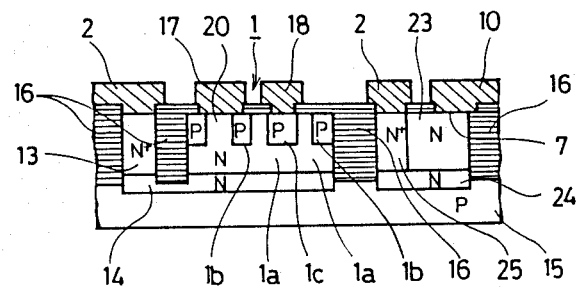

FIGS. 3A and 3B respectively illustrate a plan view and a corresponding sectional view, showing an input transistor and an SBD in a TTL-IC device according to an embodiment of the present invention.

Figure 1:
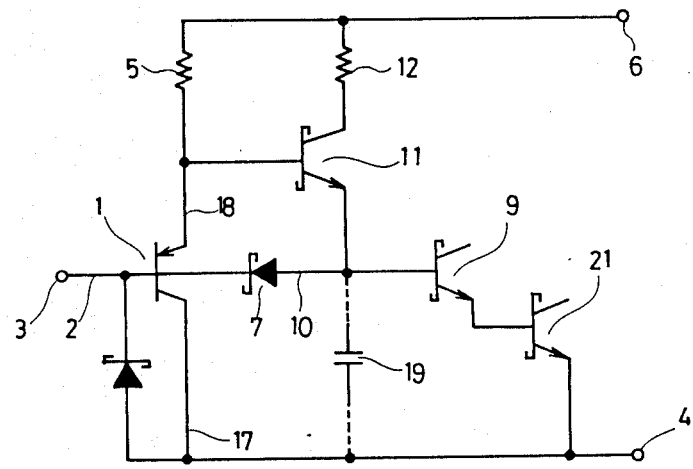
FIG. 1 is a diagram of an inverter circuit.
Figure 2A:
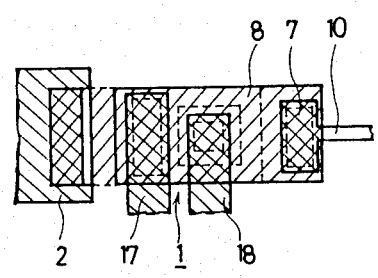
FIGS. 2A and 2B are a plan view and a corresponding sectional view respectively, in the vicinity of an input transistor in a conventional inverter.
Figure 2B:
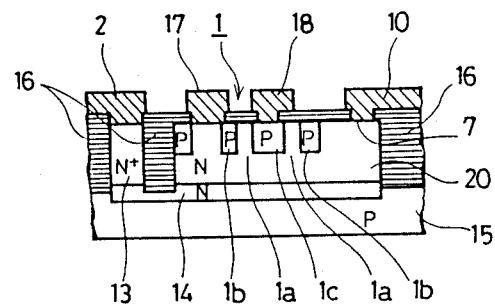

Referring to FIGS. 1, 3A and 3B, an input PNP transistor 1 is formed in an element region 26 of an N type. Similarly as in FIG. 2B, a base region 1a is connected by a metal lead 2 to an input terminal 3 through an N buried layer 14 and an N+ diffused layer 13. On the other hand, an SBD 7 is formed in another element region 22 of an N type which is separated away form the element region 26 by an isolation layer 16. An anode of the SBD 7 is connected by a metal lead 10 to an emitter of a first NPN transistor 11 and a base of a second NPN transistor 9, while a cathode of the SBD 7 is connected by the metal lead 2 to the input terminal 3 through an N epitaxial layer 23, an N buried layer 24 and an N+ diffused layer 25.

Figure 4A:
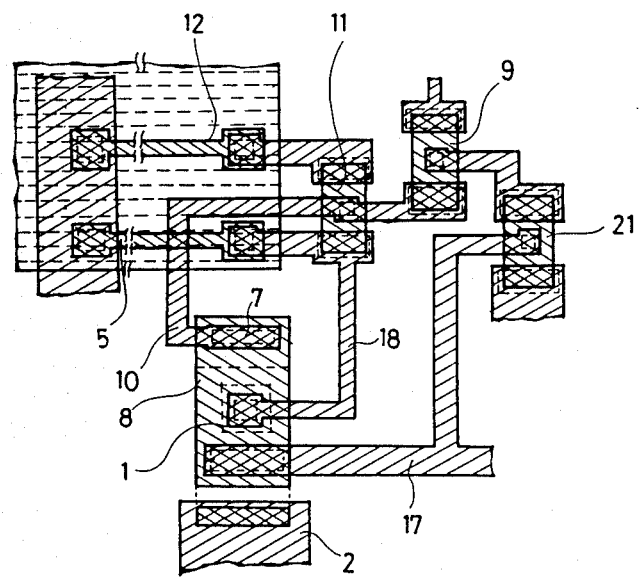
FIGS. 4A and 4B are plan views of a conventional inverter and an inverter of the present invention respectively.
Figure 4B:
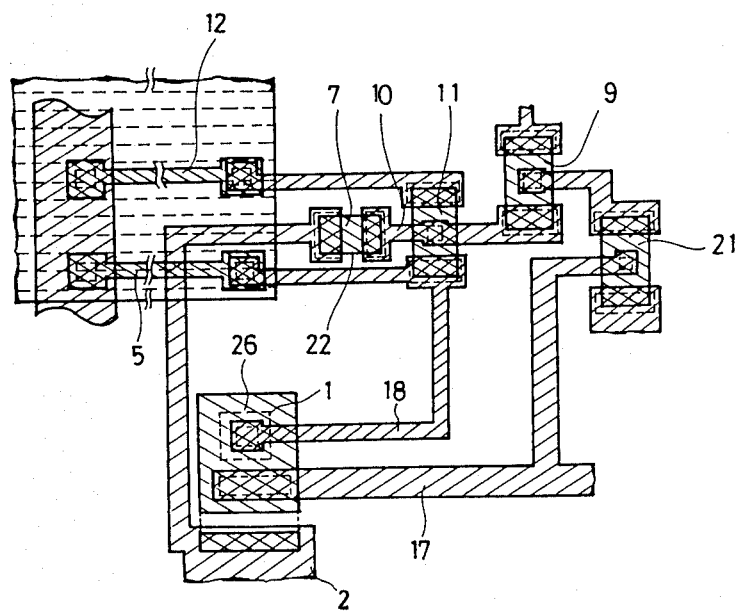

FIG. 4A shows a plan view of a conventional device which realizes the circuit of FIG. 1, and FIG. 4B shows a plan view of a device according to the present embodiment which also realizes the same circuit. Since this embodiment does not involve any change in the circuit diagram of FIG. 1, operation of the device of FIG. 4B is similar to that of the conventional one of FIG. 4A.

In the embodiment of FIG. 4B, however, the SBD 7 formed in the element region 22 is separated far away from the input PNP transistor 1 formed in the element region 26 and then allowed to come near to the first and second NPN transistors 11, 9. Therefore, total area S of the metal lead 10 is decreased and thus the parasitic capacitance 19 becomes small. Accordingly, when the input signal is changed from "L" to "H" and the second NPN transistor 9 is turned on, charging time of the parasitic capacitance 19 is significantly reduced.

For example, if the area S of the metal lead 10 is decreased from 1080 $\mu m^2$ ($S_0$: 180 $\mu m \times 6$ $\mu m$) to 300 $\mu m^2$ ($S_1$: 50 $\mu m \times 6$ $\mu m$), the time necessary for charging up the capacitance 19 will be reduced by $\Delta T$ according to the following equation.

$$\Delta T = \frac{C_0 (S_1 - S_0)(2V_{BE} - V_{IL} - V_F)}{I}$$

$$= \frac{0.0003 PF/\mu m^2 \times (300-1080)\mu m^2 \times (2 \times 0.7 - 0 - 0.4)V}{107.5 \mu A}$$

$$= -2.2 \ ns$$

In other words, the second NPN transistor 9 in the embodiment of FIG. 4B can be turned on faster by 2.2 ns than that in the conventional device of FIG. 4A.

Although a PNP transistor was adopted as the input element 1 in the above described embodiment, an SBD or a PN diode is also usable instead.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In an integrated circuit device formed on a P-type semiconductor substrate including an input PNP transistor having an emitter, a collector and a base; a first NPN transistor having an emitter, a collector and a base, the base of said first NPN transistor being connected to the emitter of said input PNP transistor by a lead wire; a Schottky barrier diode (SBD) having an anode and a cathode; and a second NPN transistor having an emitter, a collector and a base, the anode of said SBD being connected to the emitter of said first NPN transistor and to the base of said second NPN transistor, said SBD being the only SBD connected between the base of said input PNP transistor and said first and second NPN transistors, an isolation layer provided between the input PNP transistor and SBD:

an improvement for reducing parasitic capacitance in the device and thereby improving switching speed thereof, wherein the base of said input PNP transistor is connected to the cathode of said SBD by a lead wire and lengths of the lead wires by which the emitter of said first NPN transistor and the base of said second NPN transistor are connected to the anode of said SBD are shorter than that of the lead wire between the base of said input PNP transistor and the cathode of said SBD.

* * * * *